United States Patent
Wu et al.

(10) Patent No.: US 10,741,952 B2
(45) Date of Patent: Aug. 11, 2020

(54) CONNECTOR EQUIPPED WITH SPRING RETENTION MECHANISM

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Heng-Kang Wu, Shenzhen (CN); Fu-Jin Peng, Shenzhen (CN)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/260,137

(22) Filed: Jan. 29, 2019

(65) Prior Publication Data

US 2019/0252813 A1 Aug. 15, 2019

(30) Foreign Application Priority Data

Feb. 9, 2018 (CN) .......................... 2018 1 0133473

(51) Int. Cl.
| | |
|---|---|
| *H01L 23/40* | (2006.01) |
| *H01R 12/88* | (2011.01) |
| *H01R 12/71* | (2011.01) |
| *H05K 7/10* | (2006.01) |
| *H01R 12/70* | (2011.01) |

(52) U.S. Cl.
CPC ......... *H01R 12/88* (2013.01); *H01L 23/4093* (2013.01); *H01R 12/714* (2013.01); *H05K 7/10* (2013.01); *H01R 12/7076* (2013.01)

(58) Field of Classification Search
CPC .................................................. H01L 23/4093
See application file for complete search history.

(56) References Cited

U.S. PATENT DOCUMENTS

| | | | | |
|---|---|---|---|---|
| 6,646,881 | B1 * | 11/2003 | Lai ...................... | H01L 23/4006 165/80.3 |
| 7,239,518 | B2 * | 7/2007 | Yang ................... | H01L 23/4006 165/80.3 |
| 7,283,368 | B2 * | 10/2007 | Wung ................. | H01L 23/4093 165/185 |
| 7,301,774 | B2 * | 11/2007 | Lee ..................... | H01L 23/4006 165/80.2 |

(Continued)

FOREIGN PATENT DOCUMENTS

| | | |
|---|---|---|
| CN | 202363612 U | 8/2012 |
| CN | 202856026 U | 4/2013 |

*Primary Examiner* — Hung V Ngo
(74) *Attorney, Agent, or Firm* — Wei Te Chung; Ming Chieh Chang

(57) ABSTRACT

The electrical connector is equipped with a retention mechanism for securing mounting a heat sink upon a CPU which is received within an insulative housing of the connector. The retention mechanism includes a pair of seats, a pair of towers fixed to the pair of seats, respectively, a pressing device retained between the pair of towers in a deformable manner. The pressing device is intimately seated upon the heat sink to significantly press the heat sink against the CPU when the pressing device is deformed in a tensional status.

20 Claims, 13 Drawing Sheets

(56) References Cited

U.S. PATENT DOCUMENTS

| | | | | |
|---|---|---|---|---|
| 7,342,791 B2* | 3/2008 | Lee | ................... | H01L 23/4006 |
| | | | | 165/185 |
| 7,352,586 B2* | 4/2008 | Kuang | .................. | G06F 1/183 |
| | | | | 165/185 |
| 7,447,035 B2* | 11/2008 | Liu | ................... | H01L 23/4006 |
| | | | | 165/185 |
| 7,499,279 B2* | 3/2009 | Campbell | ............... | G06F 1/20 |
| | | | | 165/80.4 |
| 8,542,491 B2* | 9/2013 | Lu | ..................... | H01L 23/4006 |
| | | | | 248/188.7 |
| 8,693,200 B2* | 4/2014 | Colgan | ............. | H01L 23/4093 |
| | | | | 361/679.52 |
| 8,724,326 B2* | 5/2014 | Yang | ................. | H01L 23/4093 |
| | | | | 165/185 |
| 9,196,564 B2* | 11/2015 | Gektin | ............... | H01L 23/4006 |
| 2007/0217159 A1* | 9/2007 | Long | ................ | H01L 23/4093 |
| | | | | 361/704 |

* cited by examiner

CONNECTOR EQUIPPED WITH SPRING RETENTION MECHANISM

BACKGROUND OF THE INVENTION

1. Field of the Invention

The present invention relates generally to a retention mechanism for holding a heat sink upon a CPU (Central Processing Unit).

2. Description of Related Arts

U.S. Pat. No. 8,834,191 discloses an electrical connector for connecting a CPU to the PCB (Printed Circuit Board). Understandably, a heat sink is adapted to be mounted, via an external clip, upon the top face of the CPU which is upwardly exposed through the central opening of the load plate which is pivotally mounted to the stiffener surrounding the connector housing and downwardly press the CPU in position in the housing. Anyhow, due to increasing of contact number and the connector size, it is required to provide a relatively larger retention force upon the CPU not only for retaining the CPU in position but also enhancing the normal force between the heat sink and the CPU for superior heat dissipation. The traditional connector using the pivotal load plate cooperating with the pivotal lever can no longer satisfy such a requirement.

An electrical connector equipped with retention mechanism to provide a sufficient retention force and efficient heat dissipation for removing the heat from the CPU is desired.

SUMMARY OF THE INVENTION

An object of the invention is to provide an electrical connector for connecting a CPU to a PCB. The electrical connector is equipped with a retention mechanism for securing mounting a heat sink upon a CPU which is received within an insulative housing of the connector. The retention mechanism includes a pair of seats, a pair of towers fixed to the pair of seats, respectively, a pressing device retained between the pair of towers in a deformable manner. The pressing device is intimately seated upon the heat sink to significantly press the heat sink against the CPU when the pressing device is deformed in a tensional status.

The pressing device includes a presser and a spring set actuated by an actuator to be changed between a relaxed status and a tensioned status.

DETAILED DESCRIPTION OF THE PREFERRED EMBODIMENT

Figure 1:
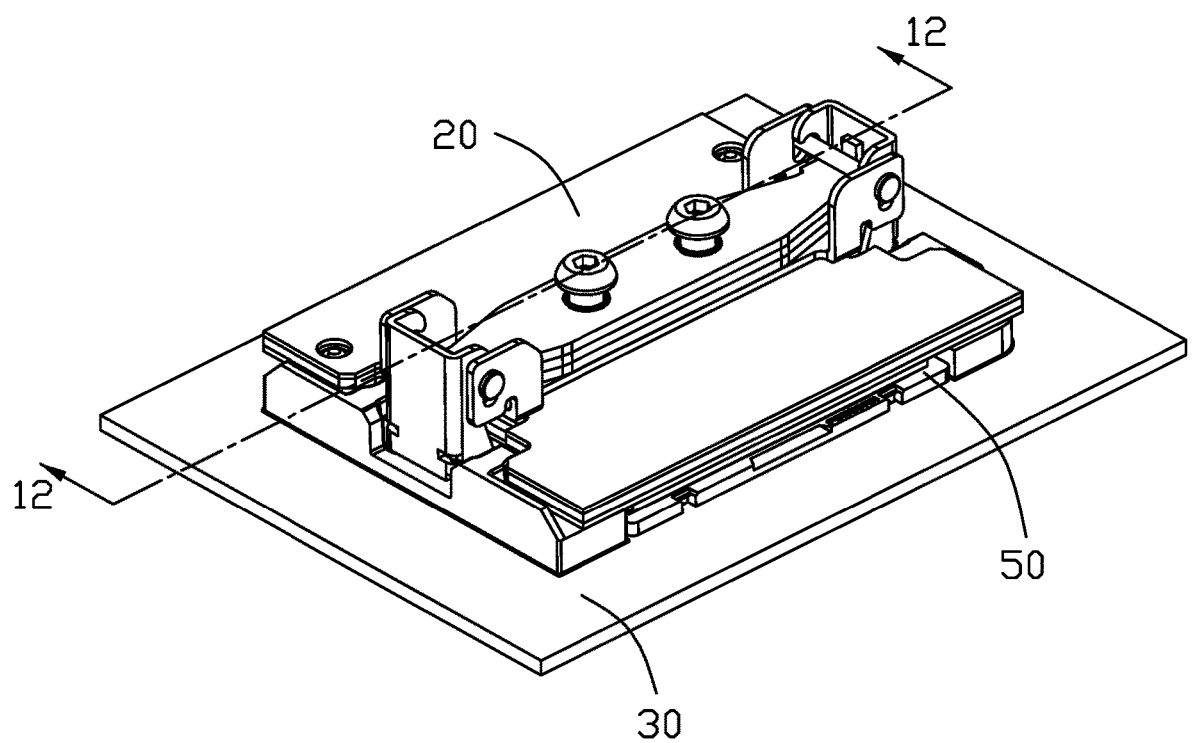
FIG. 1 is a perspective view of an electrical connector assembly according to the invention.
Figure 2:
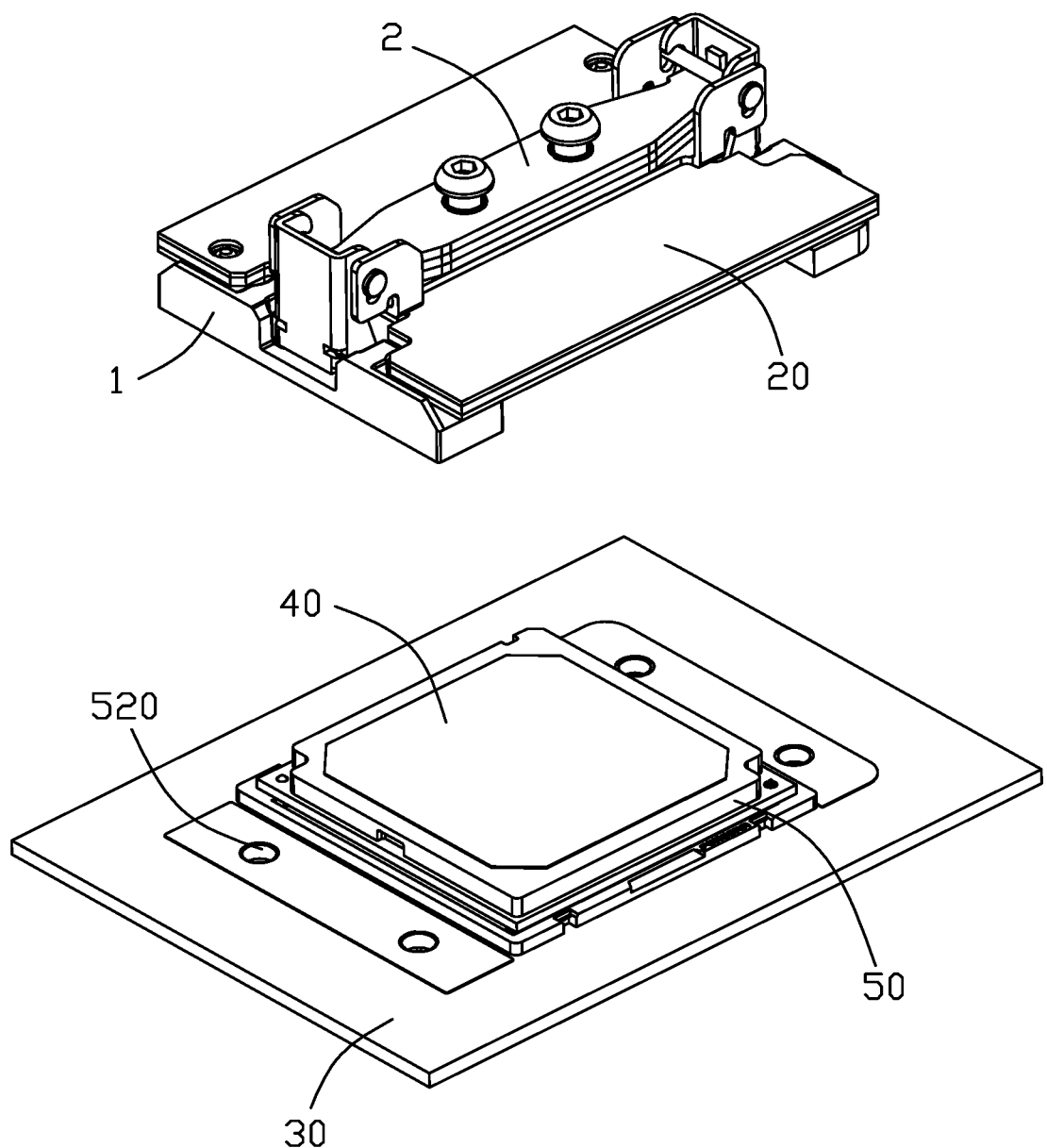
FIG. 2 is an exploded perspective view of the electrical connector assembly of FIG. 1.
Figure 3:
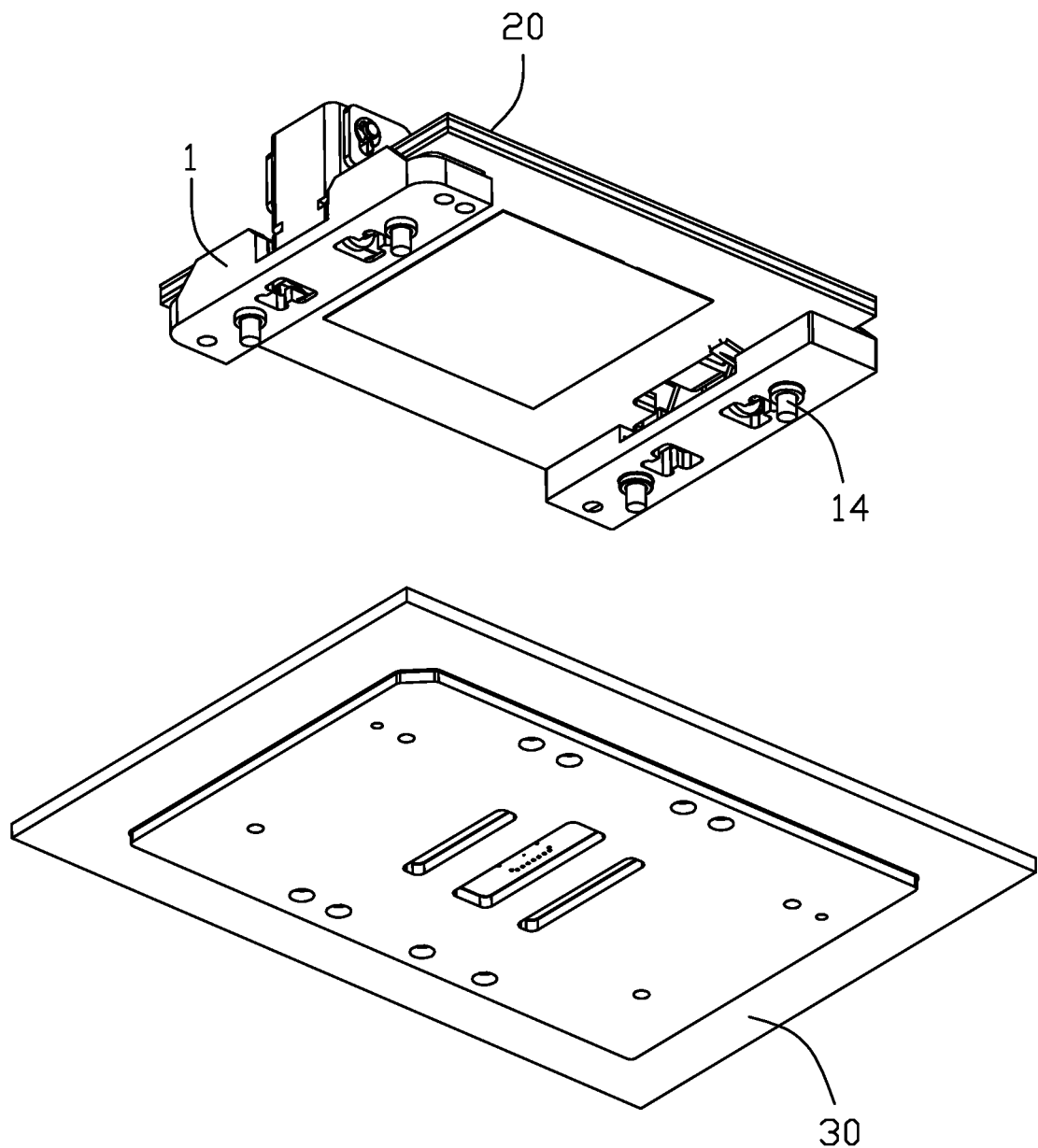
FIG. 3 is another exploded perspective view of the electrical connector assembly of FIG. 1.
Figure 4:
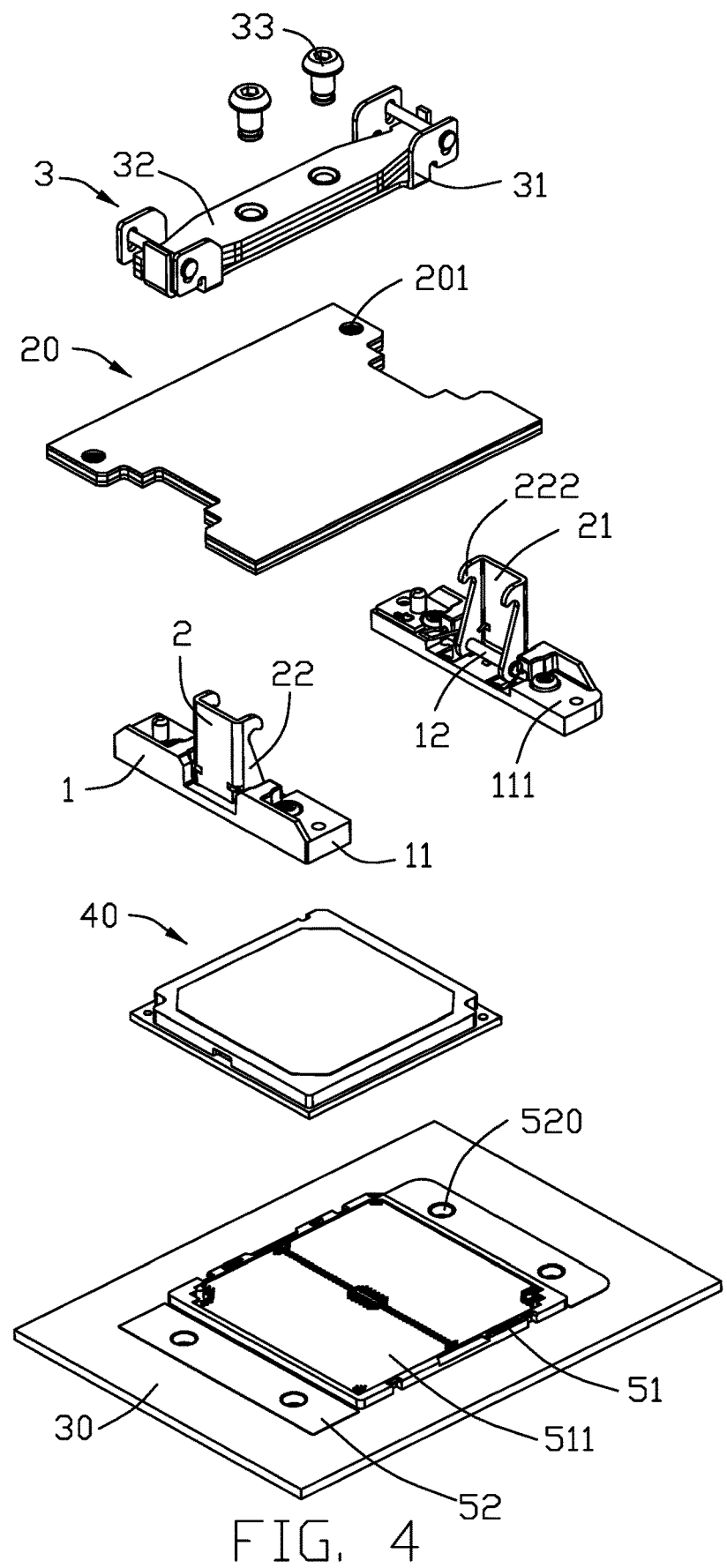
FIG. 4 is a further exploded perspective view of the electrical connector assembly of FIG. 3.
Figure 5:
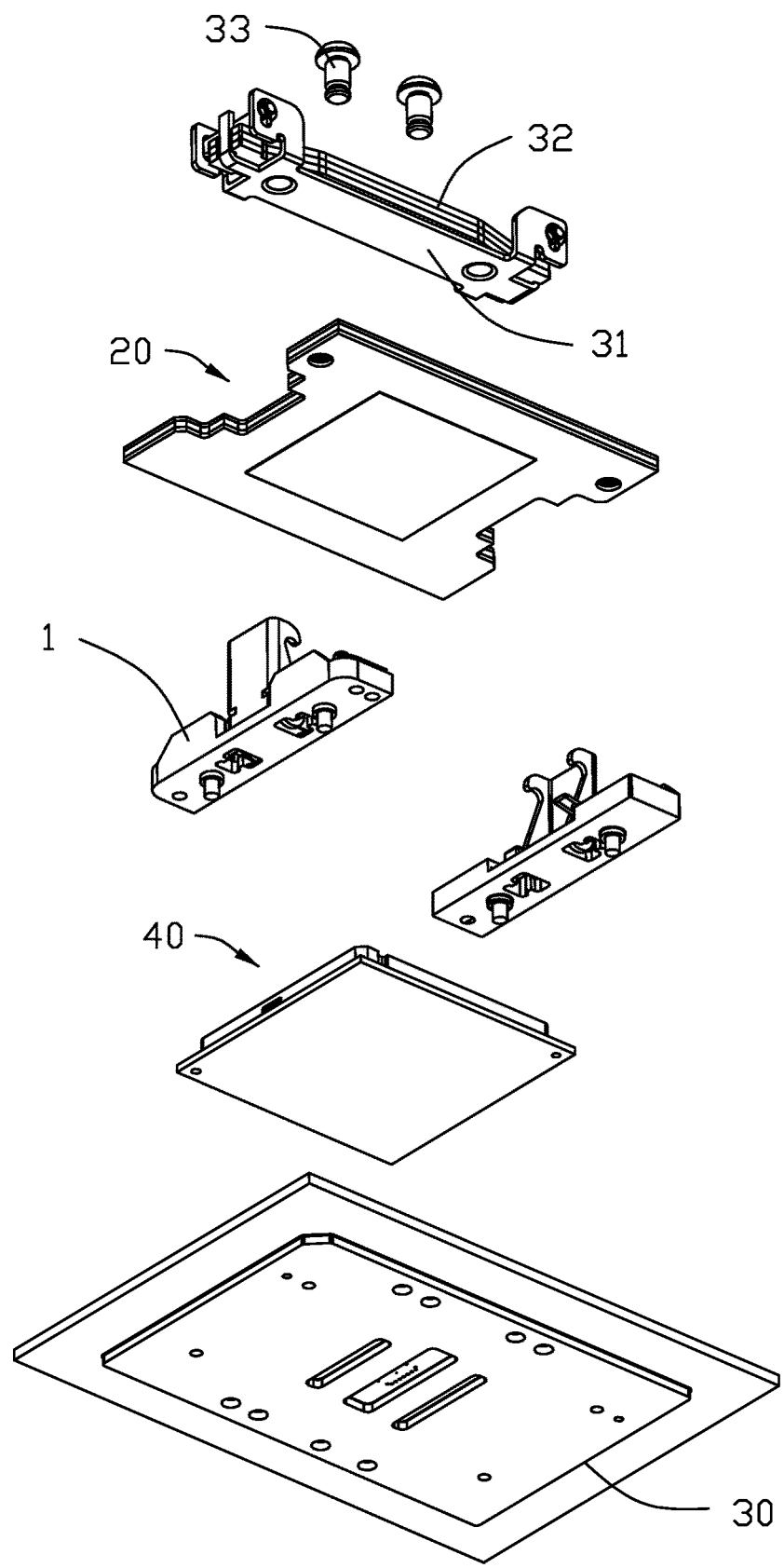
FIG. 5 is another exploded perspective view of the electrical connector assembly of FIG. 4.
Figure 6:
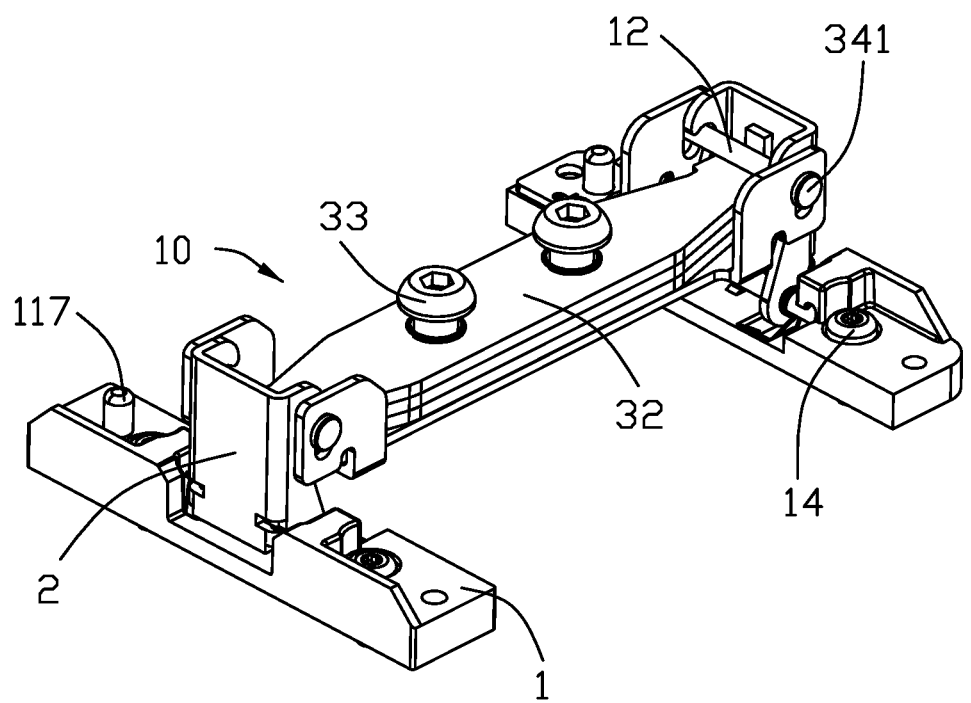
FIG. 6 is a perspective view of the retention mechanism of the electrical connector assembly of FIG. 1.
Figure 7:
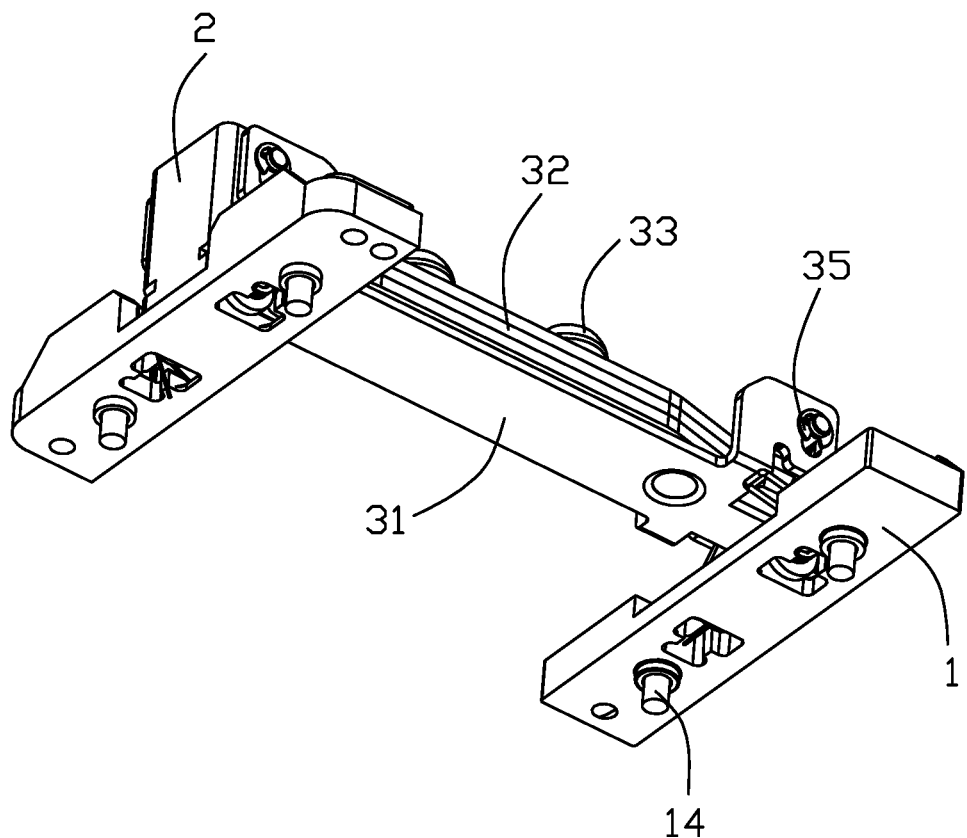
FIG. 7 is another perspective view of the retention mechanism of the electrical connector assembly of FIG. 6.
Figure 8:
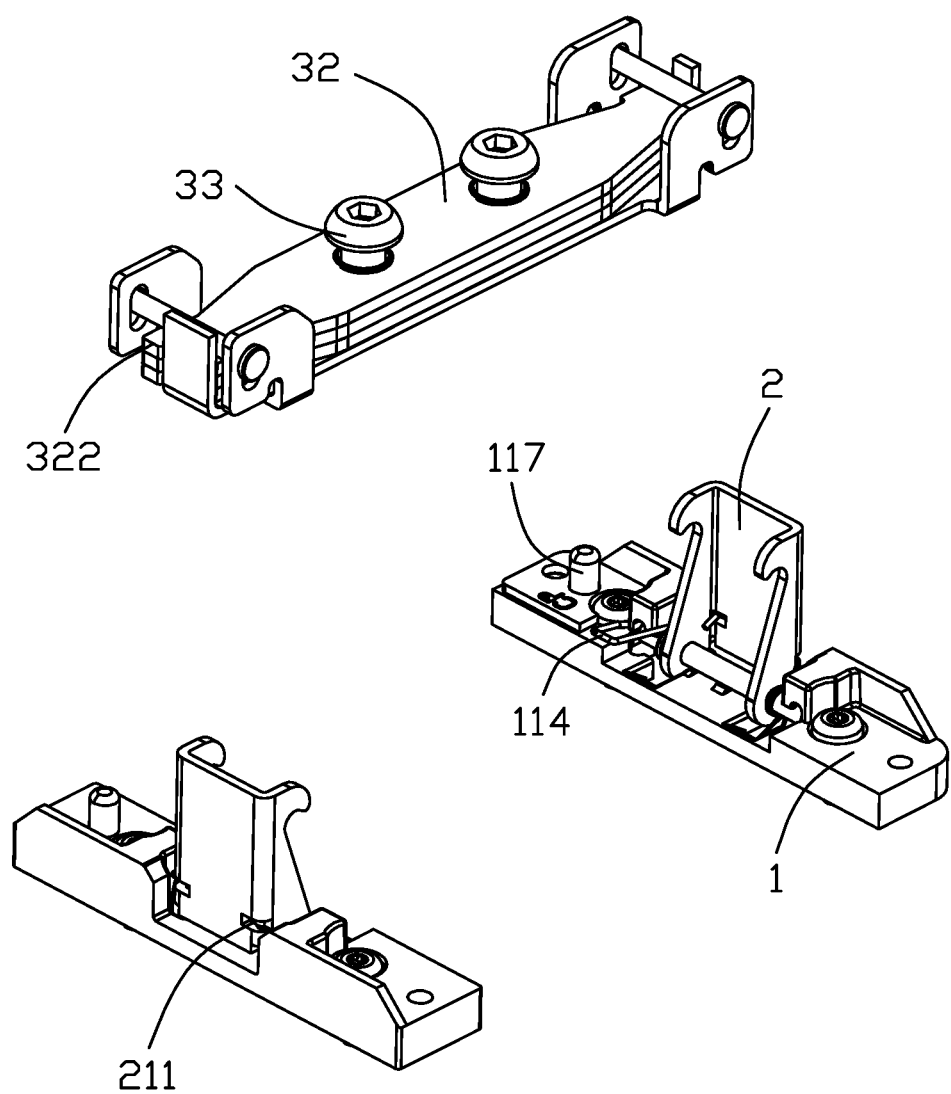
FIG. 8 is an exploded perspective view of the retention mechanism of the electrical connector assembly of FIG. 6.
Figure 9:
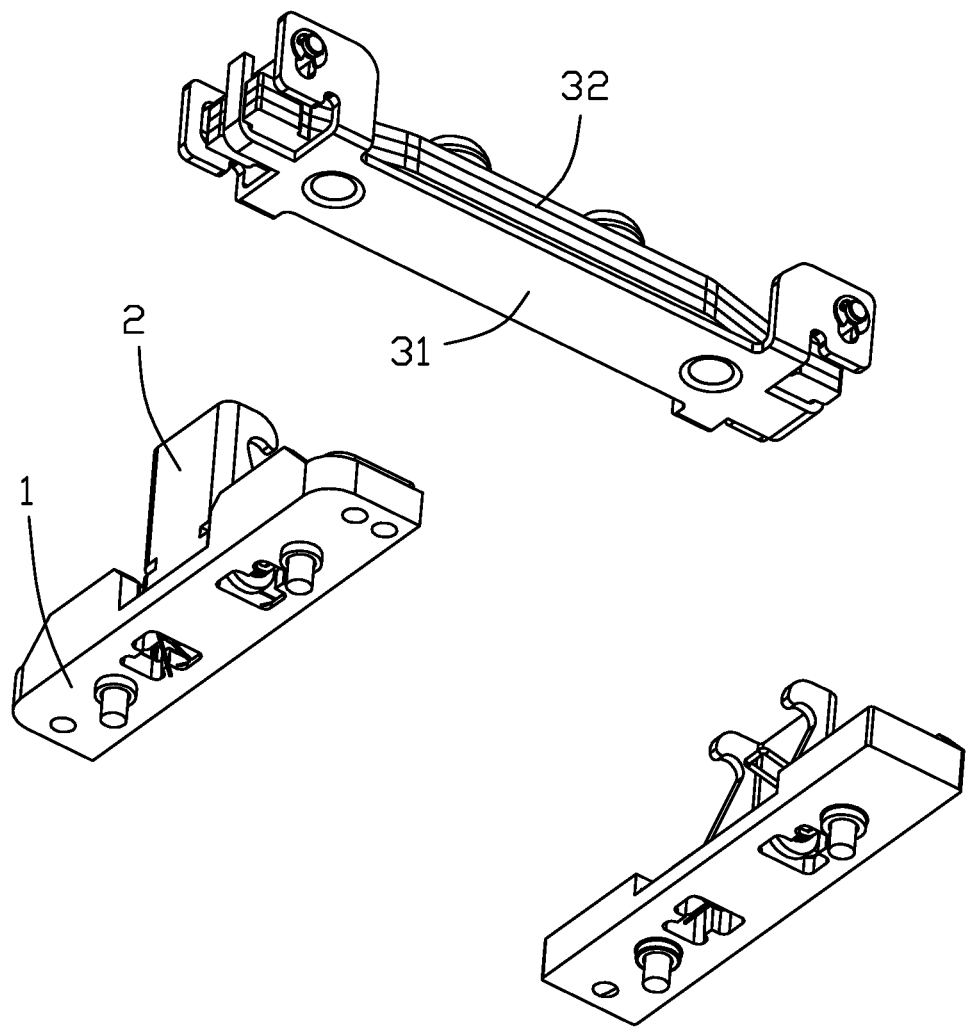
FIG. 9 is another perspective view of the retention mechanism of the electrical connector assembly of FIG. 8.
Figure 10:
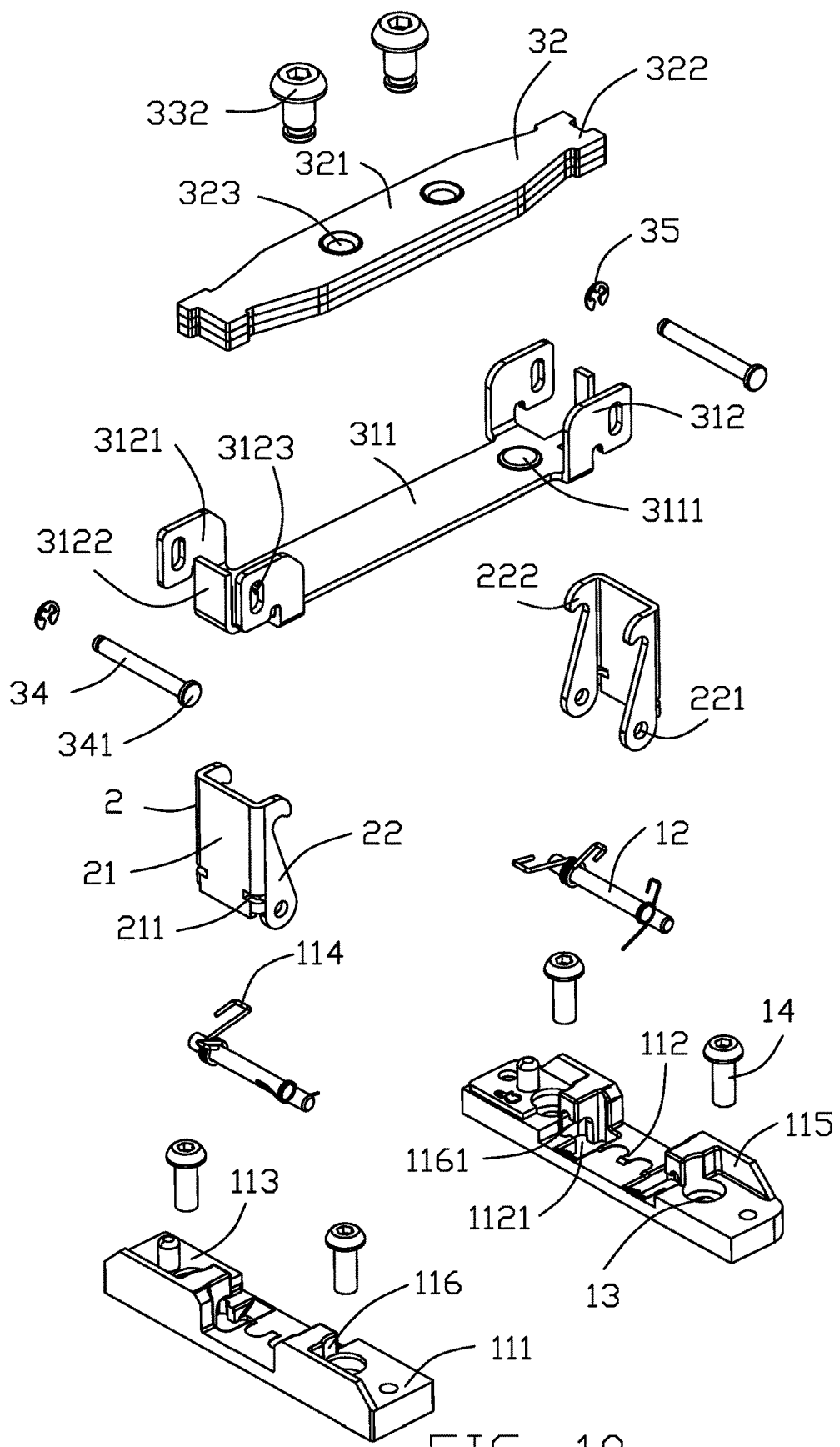
FIG. 10 is a further exploded perspective view of the retention mechanism of the electrical connector assembly of FIG. 8.
Figure 11:
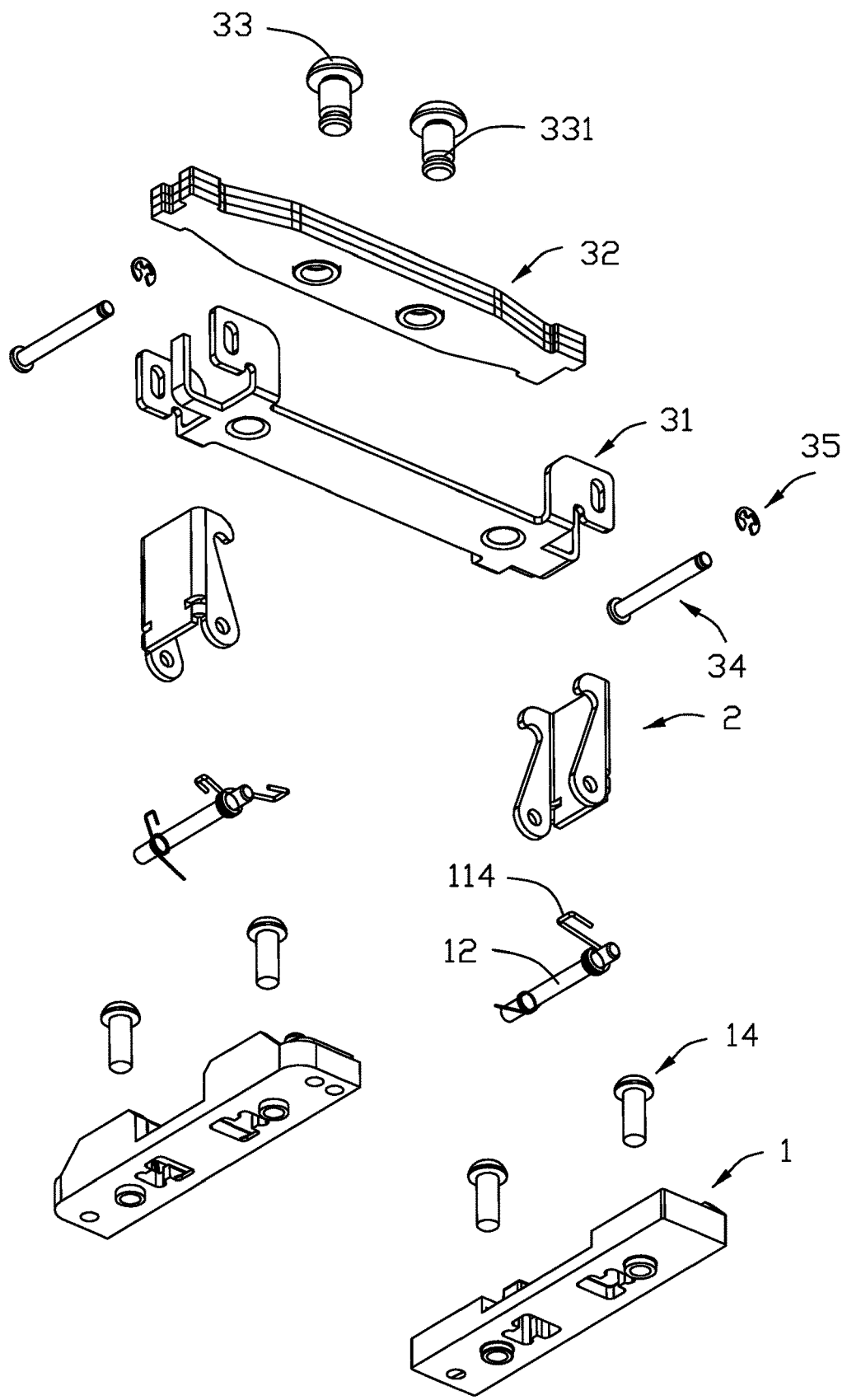
FIG. 11 is another perspective view of the retention mechanism of the electrical connector assembly of FIG. 10.
Figure 12:
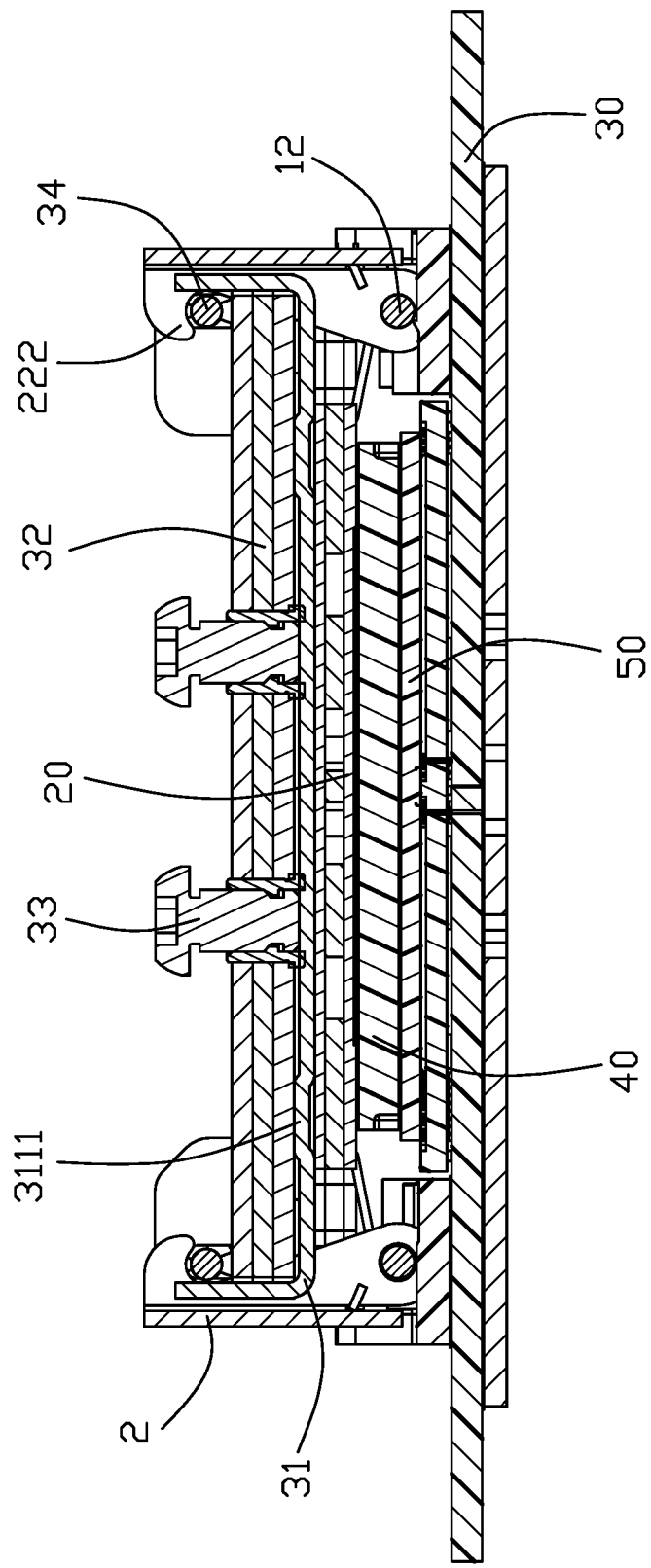
FIG. 12 is a cross-sectional view of the electrical connector assembly of FIG. 1 when the retention mechanism is in a relaxed manner.
Figure 13:
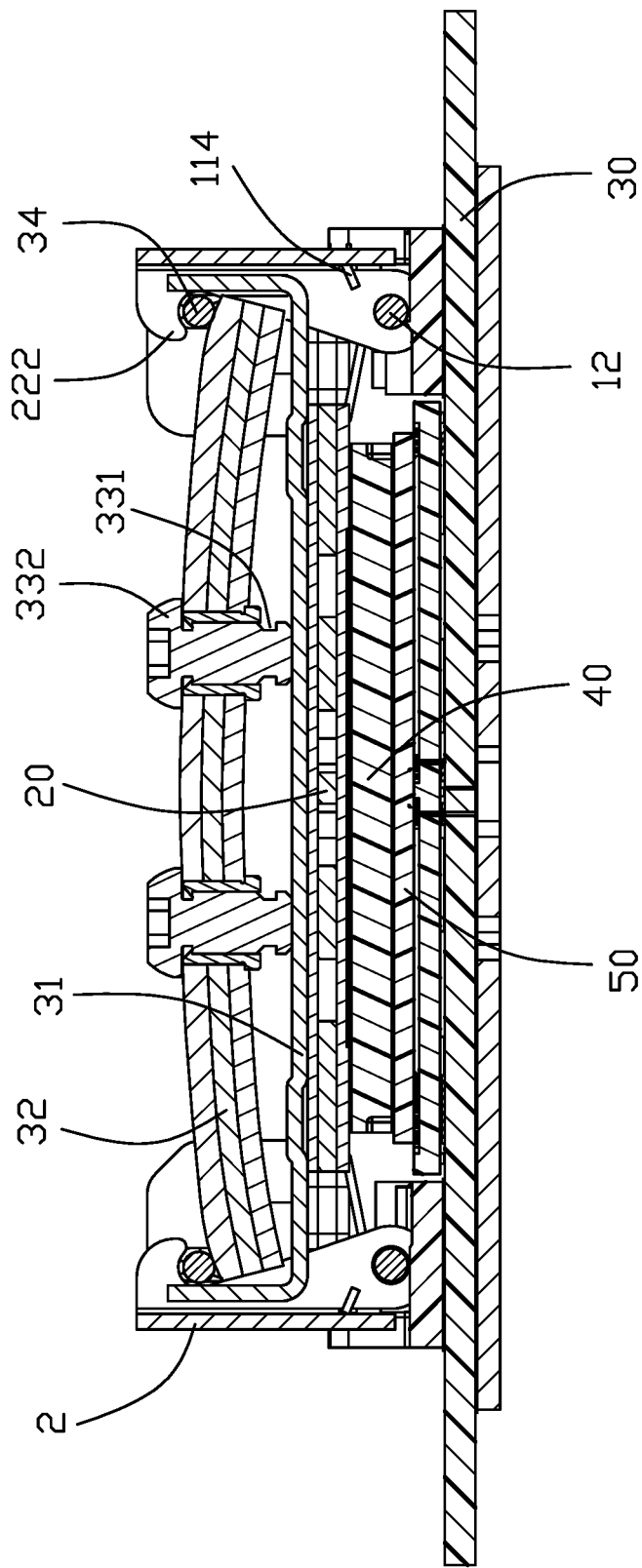
FIG. 13 is another cross-sectional view of the electrical connector assembly of FIG. 1 when the retention mechanism is in a tensioned manner.

Referring to FIG. 1-13, a retention mechanism 10 is used to secure a heat sink 20 upon the electrical connector 50 wherein a CPU 40 is received within the housing of the electrical connector 50 upon a PCB 30. The retention mechanism 10 includes a pair of seats 1, (designated as a seat set), spaced from each other along the transverse direction, a pair of towers 2, (designated as tower set), respectively mounted upon the pair o of seats 1, and a pressing device 3. The pressing device 3 is assembled upon the towers 2 to downwardly press the heat sink 20 for having the heat sink 20 intimately contact the CPU 40 thereunder for efficient heat dissipation. The electrical connector 50 includes an insulative housing 51 and a plurality of contacts (not shown) retained in the housing 51. The housing 51 forms a receiving cavity 511 for receiving the CPU 40 therein, into which the contacts extend upwardly. The heat sink 20 is seated upon the CPU 40.

The electrical connector 50 includes a pair fixing pads 52 with corresponding fixing holes 520. Correspondingly, the seat 1 includes a bottom plate 11 with a pivot 12 assembled thereto and a pair of fixing holes 13 so as to be assembled to the fixing pad 52 by a pair of fixing screws 14 extending through the fixing holes 13 and the corresponding fixing holes 520. The bottom plate 11 forms a recessed region 112 and a support region 113 with the supporting surface 111 thereon. A groove 1121 is formed in the recessed region 112. The seat 1 includes a first wall 115 on the support region 113, and a second wall 116 located between the recessed region 112 and the support region 113. The second wall 11 forms a groove 1161 communicating with the groove 1121 so as to allow the pivot 12 to be assembled in to the groove 1121. The support region 13 includes a post 117, as an alignment structure, extending from the support surface 111 to extend through the hole 201 in the heat sink 20 for assembling the heat sink 20 upon the seat 1.

The tower 2 is assembled upon the seat 1 via the pivot 12 cooperating with the torsion springs 114 in an outwardly rotatable manner, and includes a hook 222. The tower 2 includes a main plate 21 and a pair of side plates 22 on which the hook 222 is formed. The torsion spring 114 has one end retained in the hole 211 and the other end abutting against the second wall 116. The tower 2 forms a hole 221 through which the pivot 12 extends.

The pressing device 3 includes a pressing part 31, the elastic part 32 and an actuation part 33. The actuation part 33 urges the pressing part 31 to deformably press downwardly the heat sink 20. Via outward rotation of the towers 2, the pressing device 3 is downwardly positioned upon the heat sink 20. The tower 2 will be back to the vertical position after the pressing device 3 is assembled upon the heat sink 20 by the torsion spring 114 and the pressing device 3 is held in position by the hooks 222.

The pressing part 31 includes a horizontal section 311 and a pair of upstanding sections 312 at two opposite ends. The upstanding section 312 includes a first hole 3123 through which the pivot 34 extends, and the hook 222 retains the pivot 34 in position when the pressing part 31 is in a tensioned manner. The upstanding section 312 includes a pair of first extensions 3121 and a second extension 3122. The elastic part 32 is located between the pair of first extensions 3121. Each first extension 3121 forms a hole 3123 in which the pivot 34 is up and down moveable. A pair of protrusions 3111 are formed on the horizontal section 311 so as to have a space formed between the elastic part 32 and the horizontal section 311 with a first distance. Downward movement of the actuation part 33 may enlarge such a space to result in the downward deformation of the horizontal section 311, thus urging the heat sink 20 closely and intimately to significantly downwardly press the CPU 40 under the heat sink 20. Therefore, the superior heat transfer is performed. In addition, the CPU 40 is also experienced with a significantly retention force, thus assuring electrical connection between the electrical connector 50 and the CPU 40.

The elastic part 32 composed of three spring leaves stacked together, includes a plate section 321 corresponding to the horizontal section 311, and a pair of retention sections 322 at two opposite ends of the horizontal section 311 and under the pair of corresponding pivots 34, respectively. The pivot 34 forms a first end 341 larger than the corresponding hole 3123, and a clip 35 to secure the pivot 34 in the holes 3123.

The elastic part 32 forms screw holes 323 to cooperate with the screw 331 on the actuation part 33 which has a head 332 thereon. When the actuation part 33 is downwardly moved by rotation, the middle portion of the elastic part 32 is curvedly raised upward to counterbalance slight downward deformation of the horizontal section 311.

In assembling, the electrical connector 50 is mounted upon the PCB 30. The seat 1 is mounted upon the fixing pad 52 via the screw 14 extending through both the fixing hole 520 and the fixing hole 13. The pivot 12 extending through the hole 221 in the tower 2 with the associated torsion springs 14, is assembled into the groove 1121 through the groove 1161. The elastic part 32 is assembled into the pressing part 31 with the pivot 34 received within the holes 3123 and secured by the clip 35. The pressing device 3 is firstly downwardly seated upon the heat sink 20 by outwardly rotation of the tower 2 and successively held in position by confrontation between the hook 222 and the pivot 12. Lastly, the actuation part 33 is rotated to increase the space between the elastic part 32 and the horizontal section 311 so as to have the pressing device 3 is in a tensioned manner to urge the heat sink 20 to intimately press the CPU 40.

Notably, the retention mechanism 10 may adjust the height for compliance with different type/height connectors by changing the corresponding fixing pads 52 of different thicknesses. In this embodiment, the seat 1 may be made by plastic while others are made by metal. In this embodiment, the heat sink 20 is configured to be essentially confined by the retention mechanism in all the vertical direction, the horizontal transverse direction perpendicular to the vertical direction, and the longitudinal direction perpendicular to both the vertical direction and the transverse direction. In the instant embodiment, the heat sink 20 essentially covers the pair of seats 1 in the vertical direction while forming a pair of notches (not labeled) in two opposite ends to respectively receive the corresponding towers 2 in an exposed manner. The three-piece arrangement of the retention mechanism 10 also allows flexibility of the retention mechanism to comply with different type connectors and heat sinks efficiently. The actuation device 33 may be replace with other types like the cam or the wedge as long as to increase the space between the elastic part 32 and the horizontal section 311 of the pressing part 31.

What is claimed is:

1. An electrical connector assembly comprising:
a printed circuit board (PCB);
an electrical connector mounted upon the PCB to form receiving cavity;
a central processing unit (CPU) received in the receiving cavity;
a heat sink seated upon the CPU; and
a retention mechanism including:
a seat set mounted upon the PCB;
a tower set mounted upon the seat set; and
a pressing device removably retained to the tower set; wherein
the pressing device includes a pressing part and an elastic part with an actuation part operable therebetween to deform the elastic part in a tensioned manner and urge the pressing part to press the heat sink intimately; wherein
the seat set includes a post extending through a corresponding hole in the heat sink.

2. The electrical connector assembly as claimed in claim 1, wherein said actuation part increases a space between the elastic part and the pressing part in a vertical direction.

3. The electrical connector assembly as claimed in claim 2, wherein the tower set is pivotally mounted upon the seat set so as to be outwardly open in a transverse direction perpendicular to the vertical direction for loading or unloading the pressing part in the vertical direction.

4. The electrical connector assembly as claimed in claim 3, wherein the tower set is equipped with a torsion spring for assuring the tower set to be back to a vertical position after outward rotation.

5. The electrical connector assembly as claimed in claim 1, wherein the elastic part is essentially received within the pressing part.

6. The electrical connector assembly as claimed in claim 5, wherein the elastic part is restrained by a pivot which is up and down movable with regard to the pressing part.

7. The electrical connector assembly as claimed in claim 6, wherein the pivot is restrained by the tower set when the pivot is moved to an highest position.

8. The electrical connector assembly as claimed in claim 1, wherein the seat set includes a pair of seats by two sides of the electrical connector in a transverse direction, and the tower set including a pair of towers mounted upon the pair of seats, respectively.

9. The electrical connector assembly as claimed in claim 1, wherein the heat sink is confined by the retention mechanism in all a vertical direction, a transverse direction perpendicular to the vertical direction, and a longitudinal direction perpendicular to both the vertical direction and the transverse direction.

10. The electrical connector assembly as claimed in claim 1, wherein the elastic part includes a plurality of spring leaves stacked together, and the actuation part is a screw extending through a corresponding screw hole in the elastic part.

11. A retention mechanism for use with an electrical connector mounted upon a PCB (Printed Circuit Board) with a CPU (Central Processing Unit) therein and a heat sink seated upon the CPU, comprising:
  a pair of seats adapted to be mounted upon the PCB;
  a pair of towers mounted upon the pair of seats, respectively; and
  a pressing device including:
  a pressing part received between the pair of towers;
  an elastic part received within the pressing part; and
  an actuation part operable between the pressing part and the elastic part to deform the elastic part in a tensioned manner to reactively urge the pressing part downwardly against the heat sink; wherein
  the pair of towers are pivotally mounted upon the pair of seats, respectively;
  wherein
  each tower is equipped with a torsion spring to constantly urge the tower in a vertical position.

12. The retention mechanism as claimed in claim 11, wherein the pressing part includes a pair of pivots at two opposite ends in a transverse direction to downwardly restrict upward movement of the elastic part.

13. The retention mechanism as claimed in claim 12, wherein said pair of pivots are received in corresponding holes of the pressing part and up and down moveable relative thereto.

14. The retention mechanism as claimed in claim 13, wherein each tower includes a hook at a top end to restrict upward movement of the corresponding pivot.

15. A combination comprising:
  a retention mechanism for use with an electrical connector having a CPU (Central Processing Unit) therein including:
  a pair of seats;
  a pair of towers discrete from and mounted upon the pair of seats, respectively;
  a pressing part having a pressing part, an elastic part received in the pressing section, and an actuation part operable between the pressing part and the elastic part; and
  a heat sink adapted to be seated upon the CPU in a vertical direction; wherein during operation, said actuation part is operated to enlarge a space between the elastic part and the pressing part so as to urge the pressing part against the heat sink intimately in the vertical direction;
  further including means for aligning the heat sink with the pair of seats in the vertical direction; wherein
  said means includes a pair of notches formed in the heat sink to respectively receive the corresponding towers therein.

16. The combination as claimed in claim 15, wherein the towers are pivotally mounted upon the pair of seats, respectively.

17. The electrical connector assembly as claimed in claim 1, wherein the heat sink covers the seat set in a vertical direction.

18. The retention mechanism as claimed in claim 11, wherein each of said seats includes a post for extending through a corresponding hole in the heat sink.

19. The combination as claimed in claim 15, wherein each of said towers is equipped with a torsion spring to be urged to a vertical position.

20. The combination as claimed in claim 15, wherein the heat sink covers the pair of seats in the vertical direction.

* * * * *